United States Patent
Hallet et al.

(10) Patent No.: US 7,504,600 B2
(45) Date of Patent: Mar. 17, 2009

(54) CONTROL ASSEMBLY, IN PARTICULAR FOR THE TOP PART OF AUTOMOBILE VEHICLE STEERING COLUMN

(75) Inventors: Michel Hallet, Clinchamps-sur-Orne (FR); Yoann Briois, Merville Franceville (FR)

(73) Assignee: SC2N (FR)

( * ) Notice: Subject to any disclaimer, the term of this patent is extended or adjusted under 35 U.S.C. 154(b) by 0 days.

(21) Appl. No.: 12/066,199

(22) PCT Filed: Sep. 1, 2006

(86) PCT No.: PCT/FR2006/002035

§ 371 (c)(1),
(2), (4) Date: Mar. 7, 2008

(87) PCT Pub. No.: WO2007/028887

PCT Pub. Date: Mar. 15, 2007

(65) Prior Publication Data

US 2008/0195234 A1 Aug. 14, 2008

(30) Foreign Application Priority Data

Sep. 9, 2005 (FR) .................................. 05 09205

(51) Int. Cl.
*H01H 9/00* (2006.01)
(52) U.S. Cl. .................. 200/61.54; 439/502; 307/10.1; 280/775
(58) Field of Classification Search ............. 200/61.54; 439/502–504; 307/10.1, 112; 280/775, 778
See application file for complete search history.

(56) References Cited

U.S. PATENT DOCUMENTS

| 5,486,817 | A  | * | 1/1996  | Ina ............................ 340/3.42 |
| 5,761,697 | A  | * | 6/1998  | Curry et al. ................. 711/100 |
| 6,365,852 | B1 | * | 4/2002  | Leng et al. ............... 200/61.54 |
| 6,948,740 | B2 | * | 9/2005  | Chernoff et al. ............ 280/775 |
| 2006/0251416 | A1 | * | 11/2006 | Letner et al. ................... 398/45 |

FOREIGN PATENT DOCUMENTS

WO   WO 2004/098950 A2   11/2004

* cited by examiner

*Primary Examiner*—Kyung Lee
(74) *Attorney, Agent, or Firm*—Daly, Crowley, Mofford & Durkee, LLP (57) ABSTRACT

The invention concerns a control assembly, in particular for motor vehicle steering column top portion (1), comprising several switching modules (7; 9; 13; 15) and a microcontroller (19) mounted on a motherboard (17) for interpreting a switching state based on the identifier of the module to deliver an appropriate control signal, the motherboard (17) having several connecting locations (E1, E2, E3, E4), and each module (7; 9; 13; 15) having an identical number N of predetermined tracks (L1, L2, L3, L4, L5, ID1, ID2; CS1; CS2; CS3; CS4) to be connected to tracks associated with the motherboard (17). The corresponding exit tracks (L1, L2, L3, L4, L5, ID1, ID2) of each switching module (7; 9; 13; 15) are interconnected and connected together on the same input of the microcontroller (19), and the control assembly comprises for each location (E1, E2, E3, E4) means for activating reading of a switching state of a module connected at said location, said activating means being monitored by the microcontroller (19).

19 Claims, 6 Drawing Sheets

CONTROL ASSEMBLY, IN PARTICULAR FOR THE TOP PART OF AUTOMOBILE VEHICLE STEERING COLUMN

The present invention relates to a control assembly, notably for the top part of an automobile vehicle steering column.

Control assemblies for the top part of an automobile vehicle steering column are widely known in the prior art.

Such assemblies combine, in the same system, several electrical switch modules for controlling, for example, headlights, windshield wipers, audio functions, telephone functions or even speed regulators.

For many years, it has been observed that vehicles are increasingly more customized in regard to their equipment which is why it is necessary to be able to adapt the switch modules around the steering wheel to the equipment effectively present on the vehicle.

Thus, the modularity of a control assembly is an important factor for the ability to easily adapt a basic assembly with several optional modules to the needs expressed by the customer and for the ability to offer control assemblies at an acceptable cost price.

A control assembly for the top part of a steering column, which comprises modules that may be connected to a motherboard with a microcontroller, is known from the document WO2004/098950. In this document, the switching modules have identical connectors for connection to the motherboard and each module possesses an identification code. Combined with this identification code, the change of the switching state of one of the switches of a module is interpreted in such a manner as to deliver an output signal to the equipment that is to be controlled.

Thus, a high degree of modularity of this control assembly is guaranteed.

However, it is apparent in this document that all the outputs of the control modules must be connected to a corresponding input of the microcontroller which will have the drawback of a very large number of channels on the motherboard and, above all, a large number of inputs for the microcontroller, which will lead to a considerable increase in its cost price.

In order to reduce the number of inputs of the microcontroller, the aforementioned document proposes the addition of a multiplexer in the electrical circuit. However, this solution does not seem satisfactory given that an additional electronic component needs to be provided in the circuit.

Furthermore, given that a dedicated input of the microcontroller needs to be provided for each switch of a module, later modifications and future versions require modifications to the motherboard and to its components thus leading to high development costs.

The present invention aims to provide a switching system that is simpler and less costly than that of the prior art while at the same time exhibiting a satisfactory degree of modularity.

According to a secondary objective, the invention aims to provide a solution allowing the development costs for future versions to be considerably reduced.

For this purpose, the subject of the invention is a control assembly, in particular for the top part of an automobile vehicle steering column, comprising several switching modules such as a lighting control module, a windshield wiper control module, an audio function control module, a speed regulation control module, each module having its own identifier, a microcontroller accommodated on a motherboard, capable of being connected to each switching module and used to interpret a switching state as a function of the identifier of the module in order to deliver an appropriate control signal, the motherboard having several edge connectors having an identical number N of predefined connecting channels and each being capable of receiving the connection of a switching module, and each module having an identical number N of predefined channels for connecting to associated channels on the motherboard, characterized in that the equivalent output channels of each switching module are interconnected and connected together on the same input of the microcontroller, and in that it comprises, for each edge connector, means for activating the reading of a switching state of a module connected to this edge connector, these activation means being driven by the microcontroller.

Other features and advantages of the invention will become apparent from the following description, of a non-limiting character and presented by way of example, with regard to the appended drawings in which.

Figure 1:
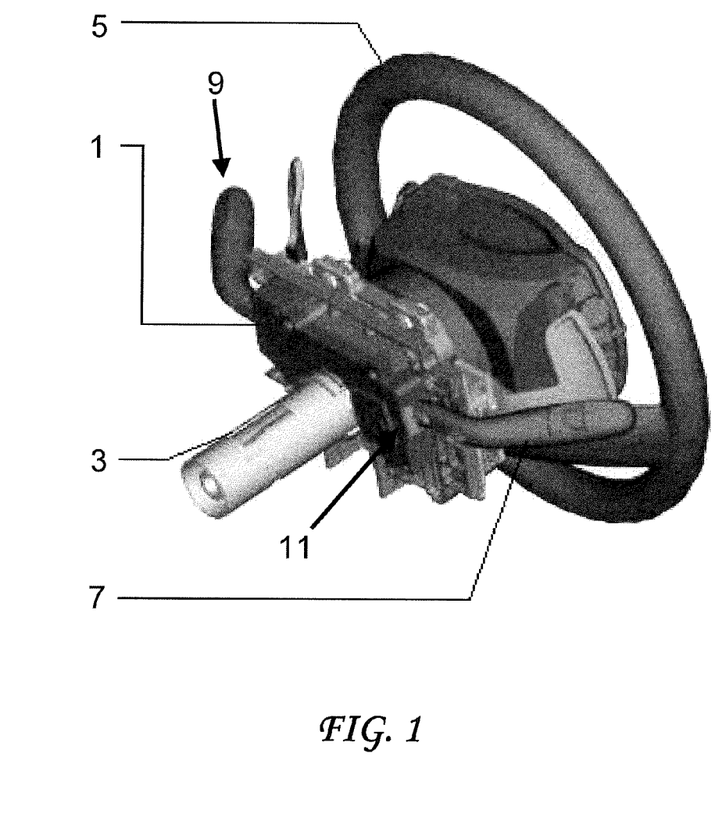
FIG. 1 shows a perspective rear view of a steering column top part for an automobile vehicle mounted on a steering column equipped with a steering wheel.

One non-limiting exemplary embodiment of the invention will be described below in relation to the appended figures FIG. 1 presents a perspective view from the rear of a control assembly 1, in particular for the top part of an automobile vehicle steering column.

This assembly 1 is mounted on a steering column 3 which carries a steering wheel 5 at its rear end.

By way of example, it can be seen in FIG. 1 that the control assembly has, on opposite sides, a lighting control lever 7 and a windshield wiper control lever 9 mounted on a central support 11.

As will be described in more detail hereinbelow, each lever takes the form of a control module, in other words that it possesses, on the one hand, an intrinsic and dedicated mechatronics system which translates a movement of a user into a change of switching state and, on the other hand, a mechanical and electrical connecting system to the support, in particular to the motherboard of the control assembly, which is standardized and therefore identical for all the modules that may be connected onto the support and to the motherboard.

The result of this is that, advantageously, each control module is able to be accommodated in each edge connector of the support 11 and, at the same time, be connected to the motherboard.

For the mechanical configurations of control assemblies with their levers and other controls, for example in order to translate a movement into a change of switching state, reference could usefully be made to the following patents FR 2782960, FR 2833553, FR 2800347.

Figure 2:
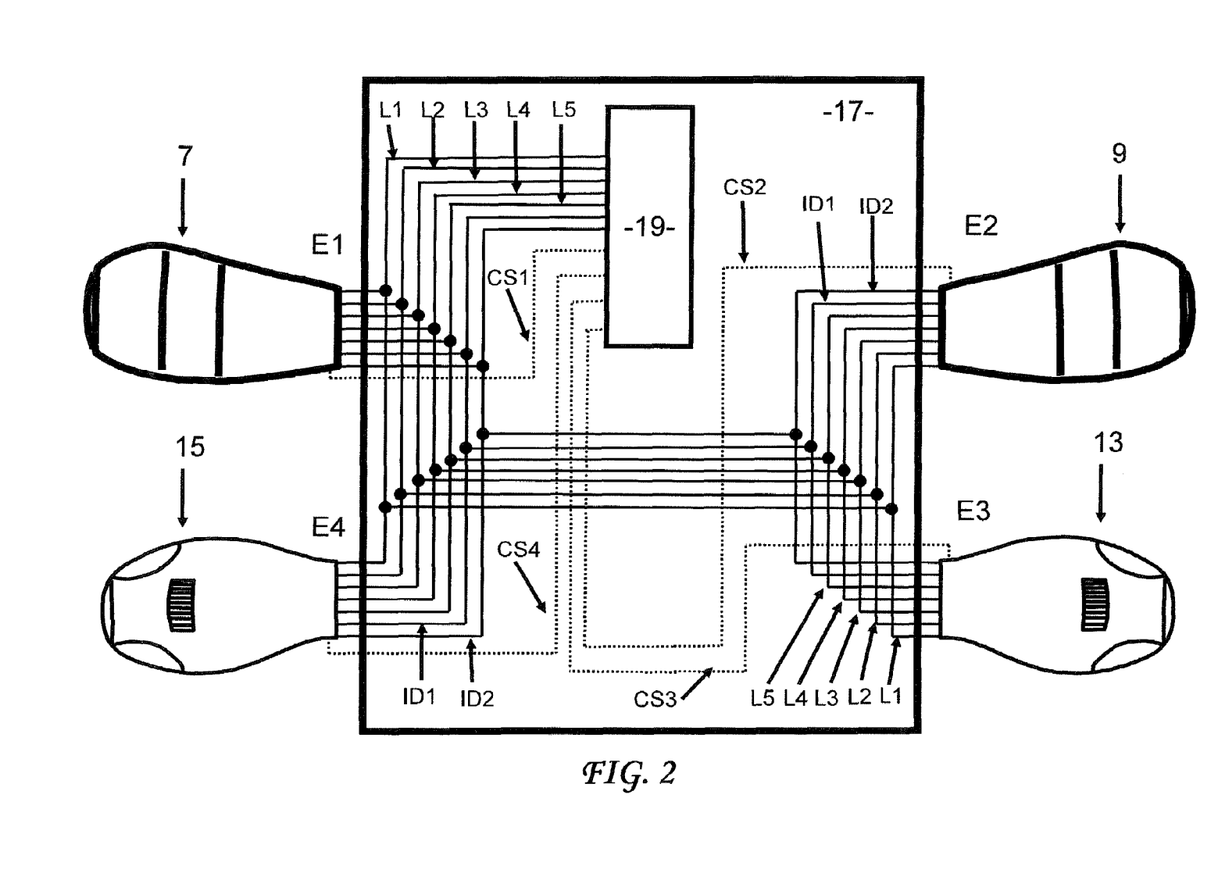
FIG. 2 shows a schematic connection circuit diagram of a control assembly according to the invention.

FIG. 2 shows a schematic connection circuit diagram of a control assembly according to the invention.

The control assembly 1 comprises several switching modules such as a lighting control module 7, a windshield wiper control module 9, an audio function control module 13 and a speed regulation control module 15 which are intended to be plugged into four edge connectors E1, E2, E3 and E4 of a motherboard 17, which for example takes the form of a PCB (Printed Circuit Board) and on which a microcontroller 19 is accommodated.

It goes without saying that, depending on requirements, even more control modules may be envisioned both as far as their number for a single support and for their functionalities are concerned. Thus, it may be envisioned to provide additional control modules, for example for telephone controls, controls for a navigation system or even for controls centralized on the steering wheel for closing the windows, the sunroof, etc.

Similarly, a higher number of edge connectors for switching module connection may be envisioned for the same motherboard without departing from the spirit of the present invention.

The connection of the modules 7, 9, 13 and 15 at the respective edge connectors E1, E2, E3 and E4 is achieved by means of a connecting system that is identical for each module between the male and female parts between the modules and the associated channels of the motherboard 17.

For this purpose, the motherboard 17 therefore has, at each edge connector E1, E2, E3 and E4, an identical number N of predefined connection channels (N being a pre-defined natural number) that can each receive the connection from a switching module.

As can be seen in FIG. 2, each module 7, 9, 13 and 15 comprises seven output channels L1, L2, L3, L4, L5, ID1 and ID2 which are connected onto the associated channels of the motherboard 17.

Among the seven channels, five channels L1, L2, L3, L4, L5 are used to transmit switching states of the module and two channels ID1, ID2 are used to transmit an identifier specific to each module to the microcontroller 19.

Depending on requirements, a higher or lower number of channels may of course be envisioned for both transmitting the switching state of the module or for transmitting the identifier to the microcontroller 19 as long as the rule that the number N of channels is identical for all the edge connectors E1 to E4 and for all the modules 7, 9, 13, 15.

During operation, the microcontroller 19 on the motherboard 17 will be used to interpret a switching state of the channels L1, L2, L3, L4, L5 as a function of the module identifier in order to deliver an appropriate control signal, for example for controlling the intermittent sweep of the windshield wipers.

Advantageously, the microcontroller 19 is configured in such a manner as to deliver its output signals onto a communications network, in particular a network bus of the LIN or CAN type.

In FIG. 2, it can be observed that, according to the invention, the equivalent output channels L1, L2, L3, L4, L5 and ID1, ID2 of each switching module are interconnected and connected together on the same analog input of the microcontroller 19 in order to be able to use the low-cost method for reading the voltage levels in order to read the switching states of each module.

According to one variant not described, at least a part of the inputs of the microcontroller receiving an output channel from a switching module is an analog input and the others are digital inputs.

In order to allow the switching modules 7, 9, 13 and 15 to be connected irrespective of the side chosen for the edge connector E1 to E4, the distribution of the equivalent channels on opposite sides of the motherboard 17 is reversed.

Thus, as seen in FIG. 2, the channels L1 of the modules 7 and 15 are at the top followed by the channels L2 to L5 and ID1 and ID2 downward, whereas the channels L1 of the modules 9 and 13 are at the bottom followed by the channels L2 to L5 and ID1 and ID2 upward.

According to the invention, the control assembly also comprises, for each edge connector, means for activating the reading of a switching state of a module connected at this edge connector E1 to E4, these activation means being driven by the microcontroller via channels CS1, CS2, CS3 and CS4. These control lines CS1, CS2, CS3 and CS4 are connected to logic outputs of the microcontroller 19. According to the present example, the lines are in the low state by default. As will be seen hereinbelow, a line CSx (x=1, 2, 3 or 4) needs to be set high (about 5V=power supply voltage) in order to be able to read the switching state of the switches of one of the edge connectors Ex (x=1,2,3 or 4).

The connection of the control lines of course follows the same rule as the channels Lx (x=1,2,3,4 or 5) or IDx (x=1 or 2), in other words that there is a reversal in order to allow the switching modules 7, 9, 13 and 15 to be connected irrespective of the side chosen for the edge connector E1 to E4.

Figure 3:
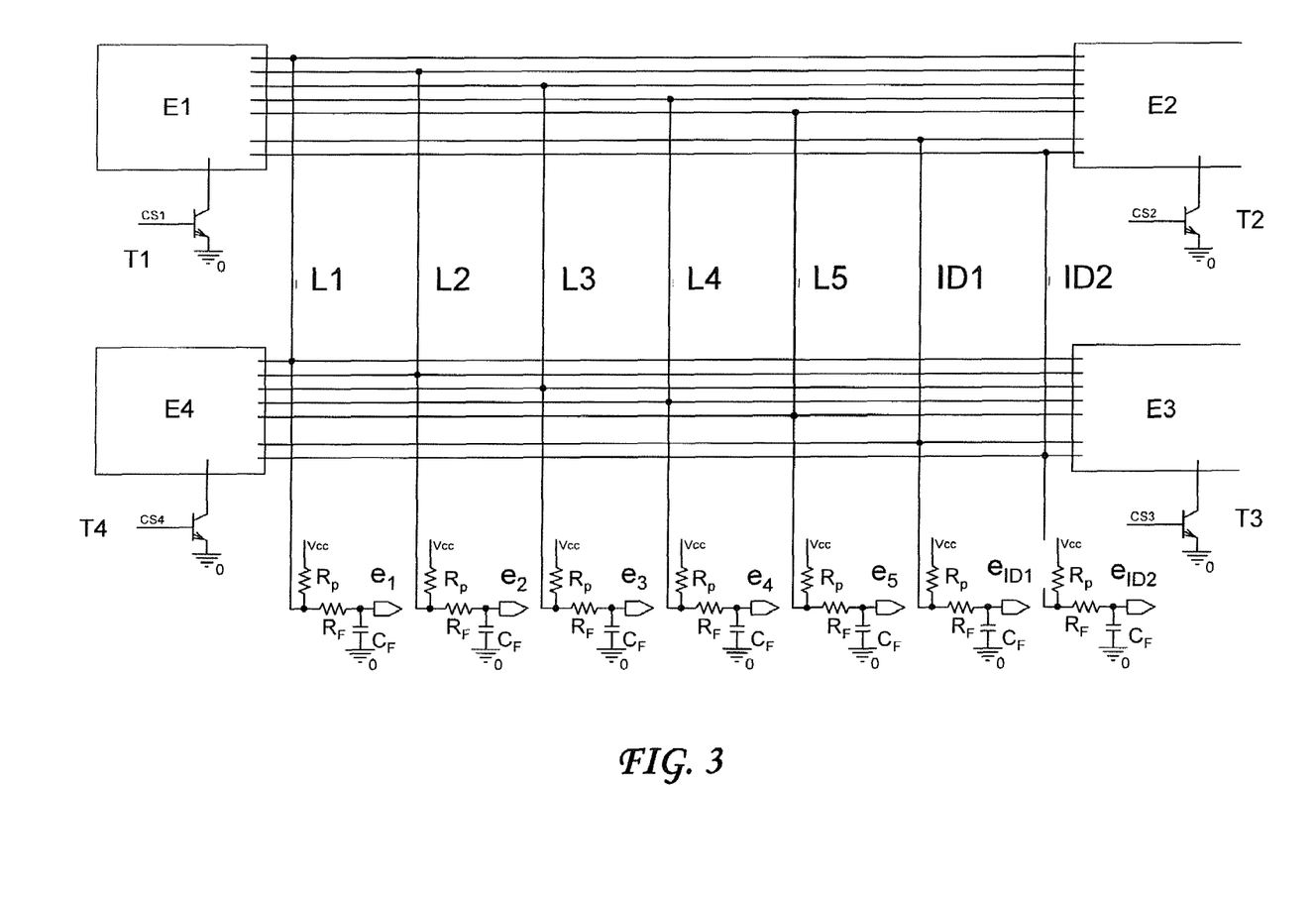
FIG. 3 shows a schematic connection circuit diagram of a motherboard of a control assembly according to the invention.

Moving on now to FIG. 3, which shows the electrical circuit of the motherboard 17 in more detail, four edge connectors E1 to E4 can be seen here for connecting the switching modules with the channels L1 to L5 for reading the switching state and the channels ID1 and ID2 for transmitting the identifier of a module to the microcontroller 19.

It will again be observed that all the equivalent channels are interconnected and connected to the same input of the microcontroller.

Thus, the lines L1 of the four edge connectors E1 to E4 are interconnected and connected to the input $e_1$ of the microcontroller.

In an analogous manner, each channel Lx (x=1,2,3,4 or 5) or IDx (x=1 or 2) is connected to the input $e_Y$ (Y=1,2,3,4,5, ID1 or ID2).

Furthermore, a conventional low-pass RC filter is provided, with a resistor $R_F$ and a capacitor $C_F$ in front of each input $e_Y$ (Y=1,2,3,4,5, ID1 or ID2) of the microcontroller in order to protect the input of the microcontroller 19.

It is also noticed that each channel Lx (x=1,2,3,4 or 5) or IDx (x=1 or 2) is connected to the power supply voltage $V_{cc}$ and thus raised via a 'pull-up' resistor $R_P$ to the supply voltage $V_{cc}$.

According to the invention, the read activation means comprise, for each edge connector E1 to E4, an electrical power supply means for the switching module connected in such a manner that, upon receiving an activation signal from a digital output of the microcontroller 19 via a corresponding control line CSx (x=1,2,3 or 4), the given switching module 7, 9, 13 or 15 is powered up so as to allow the switching states of the switches of the module to be read and such that, in the absence of this activation signal, the output channels of the switching module are at a floating potential.

According to the specific embodiment described in relation to the appended figures and by way of example, the electrical supply means for the switching module therefore comprises, on the one hand, for each output channel, a permanent connection, preferably via the matching resistor $R_p$, to a power supply voltage (Vcc) and, on the other hand, a grounding means driven by the microcontroller 19, comprising for example a transistor $T_1$, $T_2$, $T_3$ or $T_4$ for each respective edge connector Ex (x=1,2,3 or 4), connected in switching mode in such a manner that a digital output signal from the microcontroller 19 allows ground potential to be connected to the switching module in order to allow the switching states of the switches of a given module to be read.

In more detail, if the microcontroller applies a logic signal "0" to the base of one of the transistors T1 to T4, the latter is turned off and ground potential cannot be connected into the switching module, whereas if the microcontroller applies a logic signal "1" to the base of one of the transistors T1 to T4, the latter is made to conduct and ground potential will be connected into the switching module, thus allowing the switching states to be read.

Figure 4:
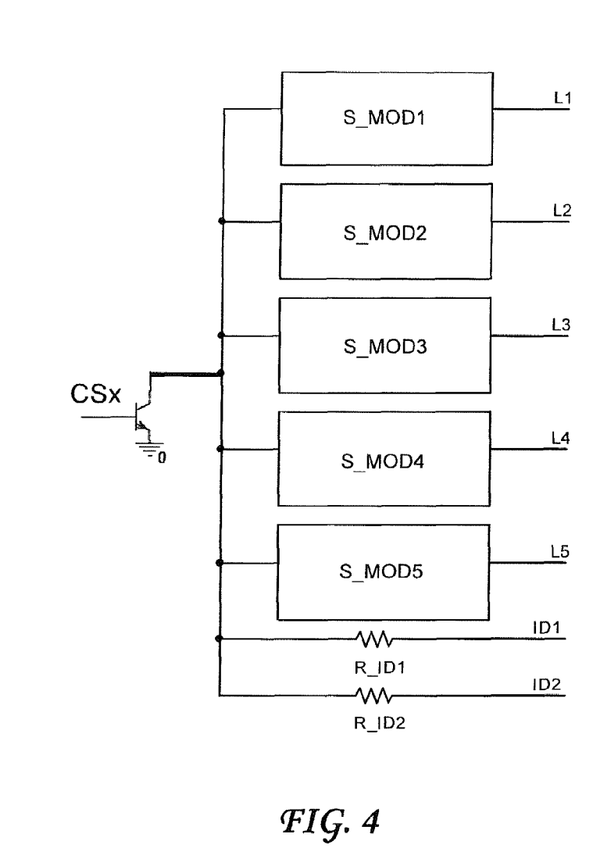
FIG. 4 shows a schematic connection circuit diagram of an example of a connection module belonging to a control assembly according to the invention.

Referring now to FIG. 4, an example of an electrical circuit diagram of a switching module 7, 9, 13 or 15 is shown here.

This switching module is composed of at least one, in the present case of five, switching sub-modules S_MODX (X=1, 2,3,4 or 5) and of an identifier formed, in the present example, by two specific resistors connected in parallel R_ID1 and R_ID2. The five switching sub-modules and the two specific resistors are therefore connected at one end via a common line to the means for activating the reading of a switching state.

Of course, in a simplified version, the identifier only needs to be formed by at least one specific electrical component for this switching module, in particular a specific resistor.

As can be seen in FIG. 4, the specific electrical components R_ID1 and R_ID2 are connected, on the one hand, to an output channel ID1, ID2 of the switching module and, on the other hand, to the grounding means driven by the microcontroller 19.

As a variant, a digital identification may also be provided with one binary coding for each identification channel.

From this figure, the activation principle for reading each edge connector Ex (x=1,2,3 or 4) will be understood.

Indeed, given that each channel Lx (x=1,2,3,4 or 5) or IDx (x=1 or 2) is connected via $R_P$ to the power supply voltage $V_{cc}$, the overall switching state of the module, together with its identifier, may only be read if the control line CSx (x=1,2,3 or 4) is set at the low level, or grounded, by the microcontroller 19.

Of course, during the overall operation of the invention, the lines CSx (x=1,2,3 or 4) are set at the low level, or grounded, one by one by the microcontroller 19 in turn and exclusively one line at a time. Indeed, the microcontroller 19 is configured in such a manner as to periodically activate, at each edge connector, the reading of the switching states.

Each sub-module S_MODX (X=1,2,3,4 or 5) comprises at least one, and preferably more than one, individual switches that can take open or closed switching states depending on the control positions applied by a user to the sub-module.

By way of non-limiting examples, a sub-module is thus provided in the form of a push-button, of a toggle switch, of an indexed thumb-wheel, of a rotating knob or of a control lever.

Figure 5:
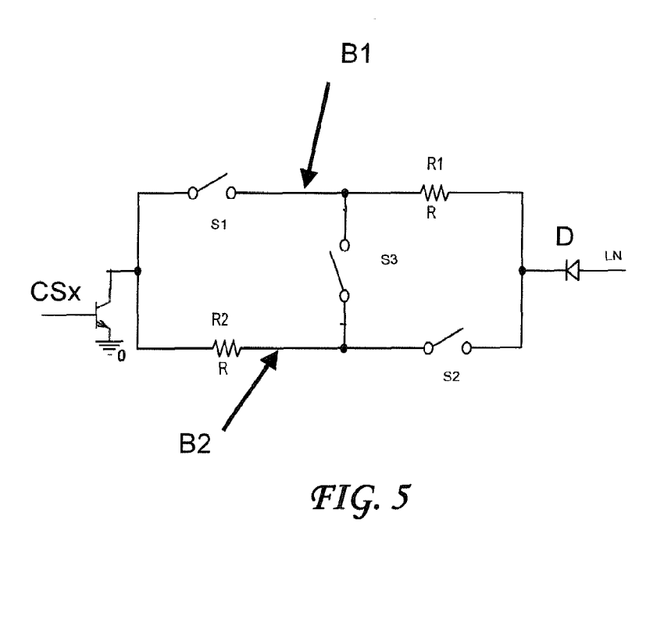
FIG. 5 shows a schematic connection circuit diagram of an example of a connection sub-module according to the invention.

One example of a particularly advantageous switching sub-module is shown in FIG. 5.

Indeed, this sub-module comprises an electrical circuit with two branches $B_1$ and $B_2$ in parallel.

Starting from the line designed to be grounded by the control line CSX, the first branch $B_1$ has a first switch S1 and a first resistor R1 in series and the second branch $B_2$ has a second resistor R2 and a second switch S2 in series.

In addition, the two branches $B_1$ and $B_2$ may be linked in the middle between, respectively, the first switch S1 and first resistor R1, on the one hand, and the second resistor R2 and second switch S2, on the other, via a third switch S3 in such a manner as to be able to obtain five voltage levels representing five different switching states for the set of the first, second and third switches.

This solution has several notable advantages, because five voltage levels with an optimized equal distribution are obtained thus reducing possible read errors. Moreover, the number of resistors can be reduced to two instead of three as in the prior art.

Furthermore, the two resistors R1 and R2 of the sub-module S_MODX are identical, preferably equal to is chosen in the range from 2 kΩ to 5 kΩ, preferably around 3.6 kΩ.

According to measurements performed, the voltages obtained with this configuration are:

| Configuration of the switches | | | Voltages obtained | | |
|---|---|---|---|---|---|
| S1 | S2 | S3 | U min | U nom | U max |
| O | O | O | 5.00 | 5.00 | 5.00 |
| O | C | O | 3.76 | 3.93 | 4.10 |
| O | O | C | 2.92 | 3.10 | 3.29 |
| C | O | C | 2.10 | 2.27 | 2.44 |
| C | C | C | 0.56 | 0.64 | 0.72 |

O - switch in question is open
C - switch in question is closed

The voltages given in the table $U_{min}$ (observed minimum voltage), $U_{nom}$ (observed nominal voltage), $U_{max}$ (observed maximum voltage) are voltages in Volts with a power supply voltage $V_{cc}$ of 5 V. The voltages $U_{min}$ and $U_{max}$ take into account the tolerances of the components.

In order to minimize interference effects between the sub-modules, a diode D is placed in the circuit in the channel LN (N=1,2,3,4 or 5).

In the following, the operation of the switching assembly will be described in detail with reference to FIGS. 6, 7 and 8.

For this purpose, it is assumed that the four switching modules 7, 9, 13 and 15 are respectively connected on the edge connectors E1 to E4 of the motherboard.

It is assumed that the microcontroller is to read the switching states of the module 7, in other words, for example, the control lever for the lighting, which is plugged into the edge connector E1, but the reading of the switching states of the other modules is effected in exactly the same way.

For this purpose, the microcontroller drives the control line CS1 high, which is represented by the digit "1" in bold next to the transistor T1. This makes the transistor T1 conduct such that the switching module 7 is now connected, on the one hand, to ground and, on the other hand, via the lines L1 to L5 together with ID1 and ID2, to the voltage $V_{cc}$.

With the digits "0" in bold next to the transistors T2 to T4, it has been indicated that, when the switching states of the module 7 are read, the microcontroller applies the low logic level thus turning off these transistors T2 to T4. Thus, the other modules 9, 13 and 15 do not interfere in the reading of the module 7 irrespective of the actions that a user may carry out on the modules and, in particular, on the on/off or selection switches of these modules.

Figure 6:
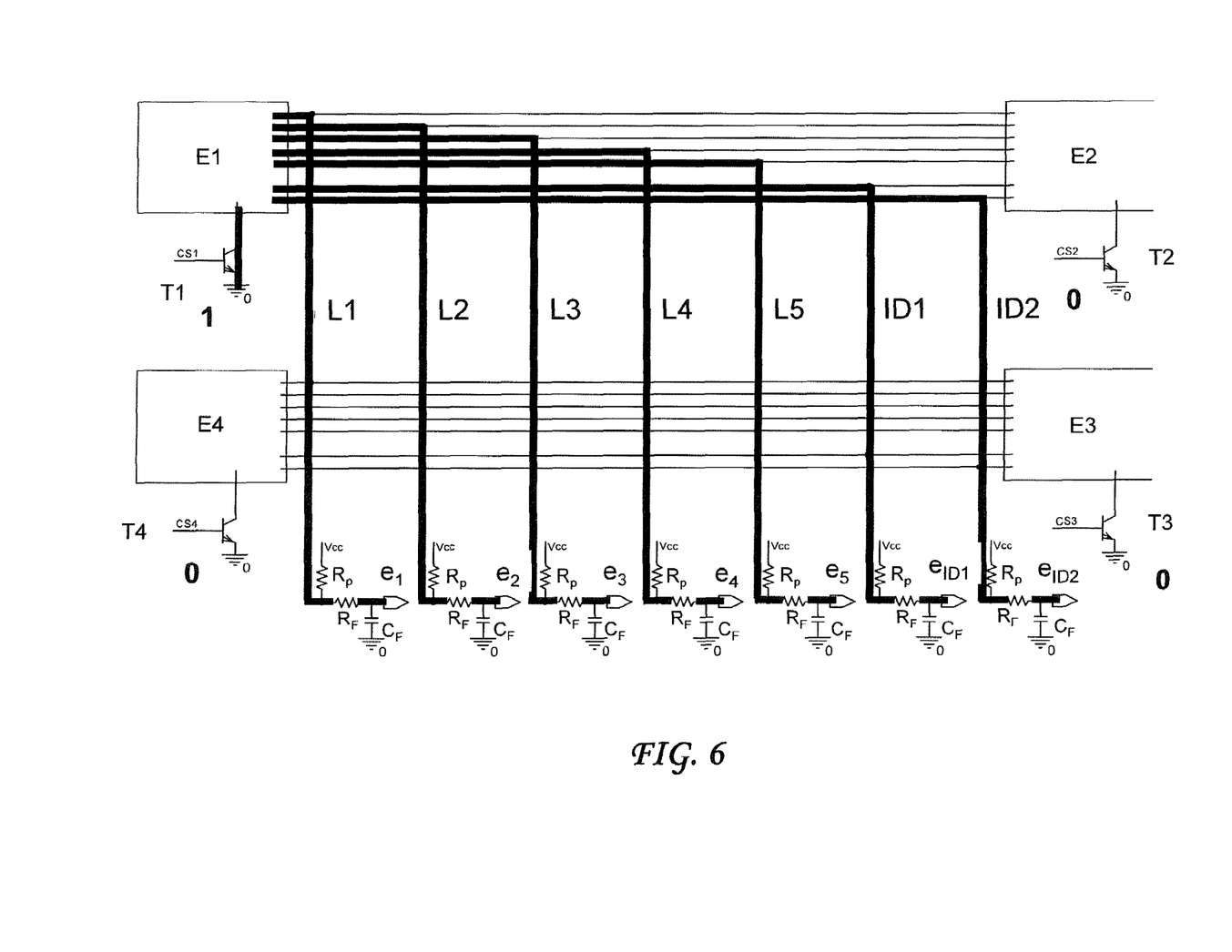
FIG. 6 shows the same circuit diagram as FIG. 3 with modifications in order to illustrate the operation of the invention.
Figure 7:
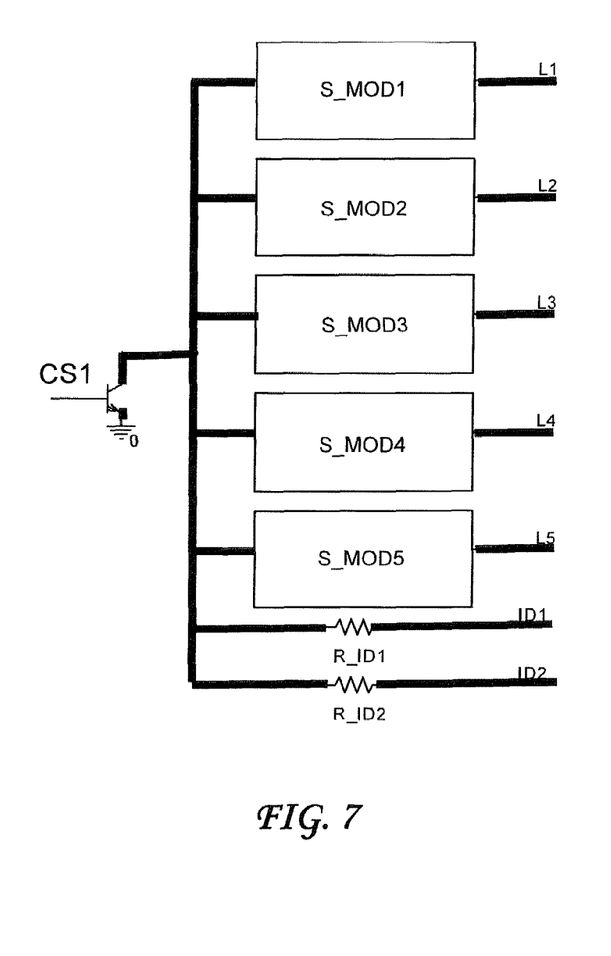
FIG. 7 shows the same circuit diagram as FIG. 4 with modifications in order to illustrate the operation of the invention.
Figure 8:
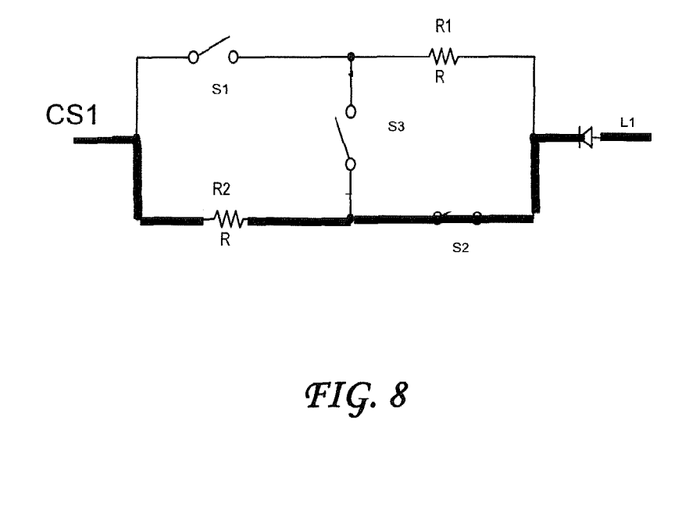
FIG. 8 shows the same circuit diagram as FIG. 5 with modifications in order to illustrate the operation of the invention.

In FIGS. 6, 7 and 8, the lines powered for reading the switching states of the module 7 are shown in bold.

Accordingly, it can be seen that the edge connector El and the switching module 7 are put into the state for reading the lines L1 to L5, together with ID1 and ID2, by the activation signal from the microcontroller 19.

Another advantage of the invention can also be noted, because even if an edge connector is empty, for example because a switching module has been removed, the operation of the switching assembly is not affected in any way. In addition, the microcontroller can tell that an edge connector is empty given that the identification lines ID1 and ID2 are both at a potential corresponding to the power supply voltage $V_{cc}$.

Considering now FIG. 7 showing the switching module 7, it is also observed how the drive signal allows the sub-modules S_MODX (X=1 to 5) and the identification resistors R_ID1 and R_ID2 to be supplied at the same time.

Then, FIG. 8 shows, by way of example, one of the sub-modules S_MODX for which the switches S1 and S3 are open and the switch S2 is closed, such that the voltage 3.96 V is measured at the input of the microcontroller for the line L1.

It will therefore be understood that the present invention may be distinguished by its ease of installation, by a reduced cost and by an exemplary possibility for modularity.

The invention claimed is:

1. A control assembly comprising:
a plurality of switching modules, each of said plurality of switching modules having its own identifier;
a microcontroller accommodated on a motherboard, said microcontroller capable of being connected to one or more of each of said plurality of switching modules, with said microcontroller used to interpret a switching state as a function of the identifier of the module;
wherein the motherboard comprises several edge connectors with each of said edge connectors having an identical number of predefined connecting channels and each of said edge connectors capable of receiving at least a corresponding one of the plurality of switching modules; and
wherein each of said plurality of switching modules is provided having an identical number of predefined channels for connecting to associated ones of the predefined channels on the motherboard; and
wherein the equivalent output channels of each of said plurality of switching modules are interconnected on the same input of the microcontroller; and
wherein each edge connector includes corresponding activation means for activating the reading of a switching state of a switching module coupled thereto; and
wherein said activation means are driven by said microcontroller.

2. The control assembly as claimed in claim 1, characterized in that each input of said microcontroller which is coupled to an output channel from a switching module is an analog input.

3. The control assembly as claimed in claim 2, characterized in that said activation means comprise, for each edge connector, an electrical power supply means for the switching module connected in such a manner that, when it receives an activation signal from a predefined output of the microcontroller, the switching module is powered up so as to allow the switching states of the switches of the module to be read and such that, in the absence of this activation signal, the output channels of the switching module are at a floating potential.

4. The control assembly as claimed in claim 3, characterized in that the electrical power supply means for the switching module comprises:
for each output channel, a permanent connection to a power supply voltage; and
a grounding means driven by the microcontroller.

5. The control assembly as claimed in claim 4, characterized in that each grounding means comprises a transistor connected in a switching mode in such a manner that a digital output signal from the microcontroller allows ground potential to be connected to the switching module in order to allow the switching states of the switches of the modules to be read.

6. The control assembly as claimed in claim 4 characterized in that:
the identifier is formed by at least one specific electrical component for each of the corresponding switching modules; and
the specific electrical component for each switching module is coupled to one or both of:
an output channel of the switching module; and
the grounding means.

7. The control assembly of claim 1 characterized in that each switching module comprises at least one identifier and one sub-module with several individual switches that can take open or closed switching states depending upon the control positions applied by a user to the sub-module.

8. The control assembly as claimed in claim 7, characterized in that a sub-module takes the form of at least one of: a push-button, a toggle switch, an indexed thumb-wheel, a rotating knob or a control lever.

9. The control assembly as claimed in claim 7 characterized in that the identifier is formed by at least one specific electrical component for each of the corresponding switching modules.

10. The control assembly as claimed in claim 7 characterized in that, in a switching module, the at least one sub-module and the at least one identifier provided by a specific component of the module are connected at one end via a common line to the activation means for a switching state.

11. The control assembly as claimed in claim 7 characterized in that at least one switching sub-module comprises an electrical circuit with two branches in parallel, a first branch having a first switch and a first resistor in series and the second branch having a second resistor and a second switch in series, where the two branches may be connected in the middle between, respectively, the first switch and the first resistor, on the one hand, and the second resistor and second switch, on the other hand, via a third switch in such a manner as to be able to obtain five voltage levels representing five different switching states of the set of the first, second and third switches.

12. The control assembly as claimed in claim 11, characterized in that the first and second resistors are provided having substantially identical resistance values.

13. The control assembly as claimed in claim 12, characterized in that the value of the first and second resistors is chosen to be between two thousand and five thousand ohms.

14. The control assembly as claimed in claim 12, characterized in that the value of the first and second resistors is chosen to be about three thousand, six hundred ohms.

15. The control assembly as claimed in claim 1, characterized in that the microcontroller is configured in such a manner as to periodically activate, at each edge connector, the reading of the switching states.

16. The control assembly as claimed in claim 1, characterized in that the microcontroller is configured in such a manner as to deliver its output signals onto a communications network, in particular a network bus of the LIN or CAN type.

17. The control assembly as claimed in claim 1, characterized in that the motherboard has edge connectors on opposite sides and in that the distribution of the equivalent channels is reversed in such a manner as to allow the switching modules to be connected irrespective of the side chosen for the edge connector.

18. The control assembly of claim 1 wherein said switching modules correspond to one or more of a lighting control module, a windshield wiper control module, an audio function control module, and a speed regulation control module.

19. The control assembly as claimed in claim 1 wherein said microcontroller interprets a switching state as a function of a switching module identifier in order to deliver an appropriate control signal.

* * * * *